(12) United States Patent
Eun

(10) Patent No.: US 7,737,017 B2
(45) Date of Patent: Jun. 15, 2010

(54) SEMICONDUCTOR DEVICE HAVING RECESS GATE AND ISOLATION STRUCTURE AND METHOD FOR FABRICATING THE SAME

(75) Inventor: Byung Soo Eun, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 12/342,648

(22) Filed: Dec. 23, 2008

(65) Prior Publication Data

US 2010/0078757 A1 Apr. 1, 2010

(30) Foreign Application Priority Data

Sep. 29, 2008 (KR) .................. 10-2008-0095555

(51) Int. Cl.
*H01L 21/3205* (2006.01)
*H01L 21/4763* (2006.01)
*H01L 23/62* (2006.01)

(52) U.S. Cl. .............................. 438/589; 257/E21.549; 257/E21.384; 257/330

(58) Field of Classification Search ................. 438/589; 257/330, E21.549, E21.546, E21.384, E21.385, 257/E21.419, E21.54, E21.545
See application file for complete search history.

(56) References Cited

U.S. PATENT DOCUMENTS

| 7,071,107 | B2 * | 7/2006 | Hieda et al. .................. 438/691 |
| RE39,690 | E * | 6/2007 | Kalnitsky et al. ........... 257/644 |
| 7,332,408 | B2 * | 2/2008 | Violette ...................... 438/435 |
| 7,588,985 | B2 * | 9/2009 | Kim ........................... 438/270 |
| 2006/0113590 | A1 * | 6/2006 | Kim et al. .................... 257/330 |
| 2007/0063270 | A1 * | 3/2007 | Cho et al. .................... 257/330 |

\* cited by examiner

*Primary Examiner*—Caridad M Everhart
(74) *Attorney, Agent, or Firm*—Marshall, Gerstein & Borun LLP

(57) ABSTRACT

Disclosed herein is a semiconductor device including an isolation structure and a recess gate and a method for fabricating the same. The method for fabricating a semiconductor device includes: forming a trench by selectively etching an isolation region of a semiconductor substrate to define an active region; forming a first SOD partially filling the trench; forming a stress shielding layer, which is denser than the first SOD, over the first SOD; forming a second SOD that fills the trench over the first SOD including the stress shielding layer; forming a recess groove by selectively etching a portion of the active region, wherein an upper surface of the first SOD is spaced downwardly from a bottom of the recess groove, and an upper surface of the stress shielding layer is spaced upwardly from the bottom of the recessed groove; and forming a gate of a transistor that fills the recess groove.

20 Claims, 13 Drawing Sheets

SEMICONDUCTOR DEVICE HAVING RECESS GATE AND ISOLATION STRUCTURE AND METHOD FOR FABRICATING THE SAME

CROSS-REFERENCE TO RELATED APPLICATION

Priority to Korean patent application No. 10-2008-0095555, filed on Sep. 29, 2008, the disclosure of which is incorporated herein by reference in its entirety, is claimed.

BACKGROUND OF THE INVENTION

The invention relates to a semiconductor device, and more particularly, to a semiconductor device structure including an isolation structure and a recess gate and a method for fabricating the same.

With increased integration of semiconductor memory devices, a design rule of circuit patterns is sharply reduced. For example, as a design rule of a Dynamic Random Access Memory (DRAM) device is reduced to less than about 50 nm, formation of finer patterns is required. Such reduction in the design rule requires superior gap fill properties in a process of forming an isolation structure. In formation of the isolation structure by a Shallow Trench Isolation (STI) method, a sharp increase in an aspect ratio of the trench and a decrease in a width of the trench, makes it necessary that the insulating material for filling the trench have superior gap fill properties.

As the design rule is sharply reduced, a process of filling the trench by a High Density Plasma process has shown a limitation. Therefore, a method of filling the trench using a Spin On Dielectric (SOD), which has superior gap fill properties compared to the HDP oxide is shown in FIG. 1.

Referring to FIG. 1, a trench 13 is formed in an isolation region, which defines an active region 11 in a semiconductor substrate 10, by a selective etching process. A pad pattern having a silicon oxide ($SiO_2$) layer 21 and a silicon nitride ($Si_3N_4$) layer 25 is formed on the active region 11. A portion of the semiconductor substrate 10 exposed by the pad pattern is then etched. A SOD 30 gap fills the trench 13. The SOD 30 is annealed for densification. Therefore, an isolation structure formed of the SOD 30 can be formed.

However, the annealing process causes a tensile stress in the SOD 30. This tensile stress is spread to the active region 11 adjoining to the SOD 30, and as a result a stress remains in the active region 11. This stress can cause slip 12 in the crystal structure of the silicon (Si) in the active region 11. This slip 12 can be generated, for example, as dislocation caused along a crystal face of the Si. The slip 12 can act as a leakage path for a carrier such as an electron or a hole during transistor operation of the DRAM device.

A refresh time of a transistor formed in the active region is lowered by the tensile stress caused in the SOD. The lowering in refresh time is particularly observed when applying a recess gate structure capable of extending a channel length of the transistor under a limited Critical Dimension (CD).

The recess gate structure generally includes a gate recess groove to extend the channel length. Spreading of the stress caused from the SOD to the bottom corner of the recess groove can result in a partial concentration of voltage to the bottom corner of the recess groove during operation of the transistor. Current leakage can be caused by this partial concentration of the voltage, and the refresh time of the memory cell of the DRAM device can be shortened accordingly.

Therefore, in order to realize an isolation structure in a device such as the DRAM device, of which design rule is sharply reduced, using the SOD, development of a method capable of lowering in operation properties of the transistor by the stress caused in the SOD is preferentially required.

SUMMARY OF THE INVENTION

Various embodiments of the invention are directed to a semiconductor device having a recess gate and an isolation structure, which can restrict lowering of the operation properties of a transistor including a recess gate by a tensile stress caused by a SOD, and a method for fabricating the same.

In one embodiment, a method for fabricating a semiconductor device includes: forming a trench by selectively etching an isolation region of a semiconductor substrate that defines an active region; forming a first SOD partially filling the trench; forming a stress shielding layer on the first SOD, the stress shielding layer being denser than the first SOD; forming a second SOD that fills the trench over the first SOD; forming a recess groove to be filled with a gate by selectively etching a portion of the active region of the semiconductor substrate, wherein the upper surface of the first SOD is spaced downwardly from the bottom of the recess groove, and the upper surface of the stress shielding layer inside the trench is spaced upwardly from the bottom of the recess groove; and forming a gate of a transistor that fills the recess groove.

The recess groove can be formed, for example, by forming a vertical upper groove part having a first Critical Dimension (CD); and forming a bulb part having a relatively wide second CD as the bottom of the recess groove by etching the bottom of the upper groove part. The stress shielding layer can be formed so that the upper surface inside the trench is spaced upwardly from the upper end of the bulb part and the lower surface of the stress shielding layer is spaced downwardly from the lower end of the bulb part.

The method can include forming the first SOD of a polysilazane based dielectric material.

The first SOD can be formed by coating the first SOD on the semiconductor substrate so as to fill the trench; curing the first SOD; lowering a height of the surface of the first SOD by etching the first SOD; and annealing the first SOD to densify the first SOD.

The first SOD can be etched so that the upper surface of the first SOD is spaced downwardly from the bottom of the recess groove by a distance in a range of 400 to 700 Å.

The method can include forming the stress shielding layer by depositing a High Density Plasma (HDP) oxide layer.

The HDP oxide layer can be deposited by an In Situ Etch Assist (ISEA) deposition, in which an etch source gas is provided together with a silicon source gas and oxidation source gas, and the deposition and etching are performed at substantially the same time.

The method can include depositing the stress shielding layer so as to have an upper surface spaced upwardly from the bottom of the recess groove by a distance in a range of 200 to 400 Å.

The method can further include removing an overhang portion generated in an entrance of the trench by wet etching the stress shielding layer.

The stress shielding layer can be formed so that the upper surface of the stress shielding layer is spaced upwardly from the bottom of the recess groove by a distance that is greater than the width of the bottom of the recess groove.

In another embodiment, a method for fabricating a semiconductor device includes: forming a trench by selectively etching an isolation region of a semiconductor substrate that defines an active region; forming a first SOD for partially filling the trench; forming a stress shielding layer on the first SOD, the stress shielding layer being denser than the first SOD and having a concave shape; forming a second SOD that fills the trench over the first SOD; forming a recess groove comprising a vertical groove part and a bottom bulb part by selectively etching a portion of the active region of a semiconductor substrate, wherein the upper surface of the first SOD is spaced downwardly from the lower end of the bulb part of the recess groove, and the side wall of the stress shielding layer extends vertically to cover a portion of the side wall of the trench, which is spaced upwardly from the upper end of the bulb part of the recess groove; and forming a gate of a transistor that fills the recess groove.

The method can include forming the stress shielding layer of a HDP oxide layer.

The method can further include etching the stress shielding layer so that the vertical side wall to expose an entrance side portion of the side wall of the trench.

The method can further include etching a bottom of the stress shielding layer to expose at least a portion of the first SOD, wherein the etched stress shielding layer has a side wall spacer shape.

In another embodiment, a semiconductor device includes: a gate of a transistor filling a recess groove formed in an active region on a portion of a semiconductor substrate; a trench for an isolation region formed in another portion of the semiconductor substrate so as to define the active region; a first SOD partially filling the trench and having an upper surface spaced downwardly from a bottom of the recess groove; a stress shielding layer formed on the first SOD, the stress shielding layer being denser than the first SOD and having an upper surface inside the trench spaced downwardly from the bottom of the recess groove; and a second SOD formed over the first SOD and the stress shielding layer and filling the trench.

The SOD can include a polysilazane based dielectric material and the stress shielding layer can include a HDP oxide layer.

The upper surface of the first SOD can be spaced downwardly from the bottom of the recess groove by a distance in a range of 400 to 700 Å, and the upper surface of the stress shielding layer can be spaced upwardly from the bottom of the recess groove by a distance in a range of 200 to 400 Å.

In another embodiment, a semiconductor device includes: a gate of a transistor filling a recess groove formed in an active region on a portion of a semiconductor substrate and includes a vertical groove part and a bottom bulb part; a trench for an isolation region formed in another portion of the semiconductor substrate so as to define the active region; a first SOD partially filling the trench and having an upper surface spaced downwardly from the bottom of the recess groove; a concave shaped stress shielding layer formed on the first SOD, the stress shielding layer being denser than the first SOD and having a vertical side wall extended to cover a portion of a side wall of the trench spaced upwardly from an upper end of the bulb part of the recess groove; and a second SOD formed over the first SOD and the stress shielding layer and filling the trench.

The vertical side wall of the stress shielding layer can be disposed below an entrance portion of the side wall of the trench.

A bottom of the concave shape can expose at least a portion of the first SOD.

According to the embodiments of the invention, a semiconductor device having a recess gate and an isolation structure, which can restrict lowering of operation properties of a transistor due to a tensile stress caused by a SOD when forming a STI structure using a SOD, and a method for fabricating the same can be provided.

DESCRIPTION OF SPECIFIC EMBODIMENTS

Embodiments of the invention are directed to a semiconductor that can prevent the lowering of the operation properties of a transistor including a recess gate by a tensile stress caused by a SOD layer during formation of a STI structure using the SOD. The semiconductor includes an isolation structure having a HDP oxide layer disposed in a portion of the isolation trench corresponding to the bottom of a recess groove, and SOD layers disposed at the upper and lower sides of the HDP oxide layer to fill the isolation trench.

The HDP oxide layer is relatively denser than the SOD layer, thus making it difficult for a stress to be generated and spread. The HDP oxide layer is disposed in the portion of the isolation trench corresponding to the bottom of the recess groove, making it possible to effectively restrict the tensile stress caused by the SOD from having a direct influence on the recess groove. Therefore, it is possible to effectively restrict degradation of operation properties of the transistor having a recess gate structure by the influence of the tensile stress generated in the SOD. For example, it is possible to prevent shortening of a refresh time of a memory cell of a DRAM device, i.e. a memory cell having a transistor and a capacitor, i the stress.

Also, since the isolation trench is substantially filled with the SOD layer, it is possible to fill the isolation trench having a very narrow width or a high aspect ratio without forming a void, by utilizing relatively high gap fill properties of the SOD. Therefore, it is possible to realize a semiconductor device employing fine pattern of which the design rule is very small.

In addition, since the HDP oxide layer introduced between the upper and lower SODs is a relatively dense layer, it is possible to restrict spreading of the tensile stress generated in the SOD layer to an active region. Therefore, it is possible to minimize or eliminate slip or dislocation is caused in the silicon crystal in the active region by the tensile stress generated in the SOD. Therefore, it is possible to enhance reliability of electrical operation properties of the transistor formed on the active region.

FIGS. 2 to 9 illustrate a semiconductor device having a recess gate and an isolation structure and a method for fabricating the same according to an embodiment of the present invention.

Figure 1:
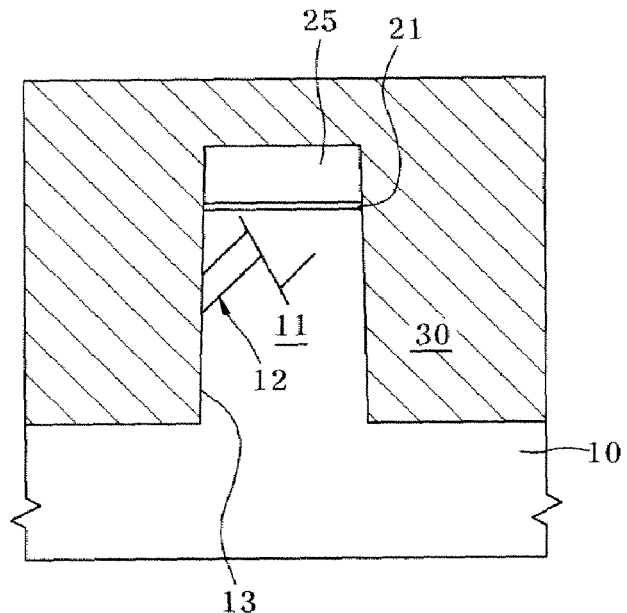
FIG. 1 is a cross-sectional view illustrating a prior art semiconductor having a defect in an isolation structure employing a SOD.
Figure 2:
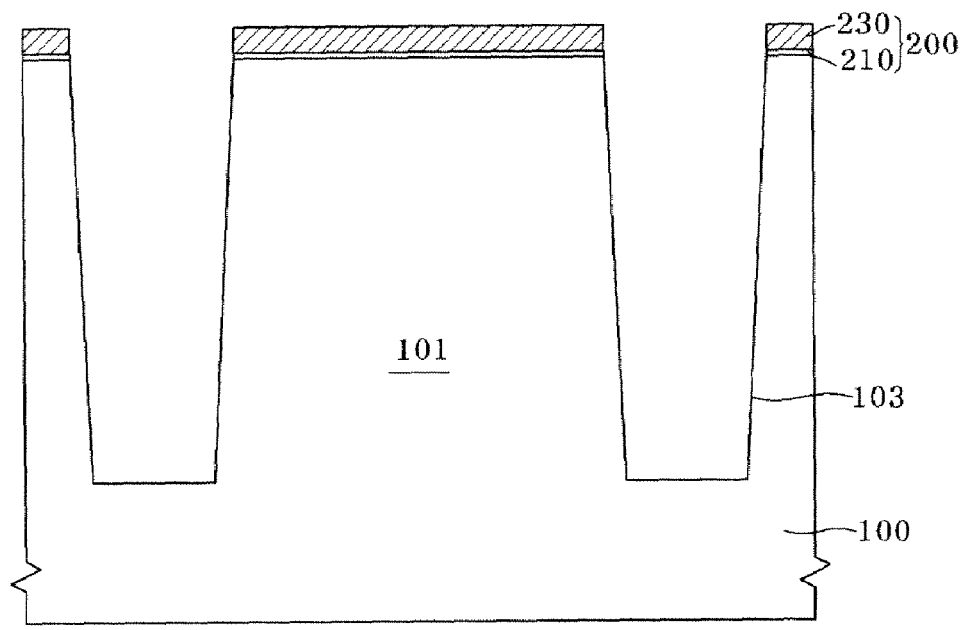
FIGS. 2 to 9 are cross-sectional views illustrating a semiconductor device having a recess gate and an isolation structure and a method for fabricating the same according to an embodiment of the invention.

Referring to FIG. 2, a pad pattern 200 is formed over an active region 101 of a semiconductor substrate 100. The pad pattern 200 can include, for example, a silicon oxide ($SiO_2$) pad 210 and a silicon nitride ($Si_3N_4$) pad 230. The region of the semiconductor substrate 100 exposed by the pad pattern 200 is an isolation region that defines the active region 101. The isolation region is selectively etched to form a trench 103 for isolation.

Figure 3:
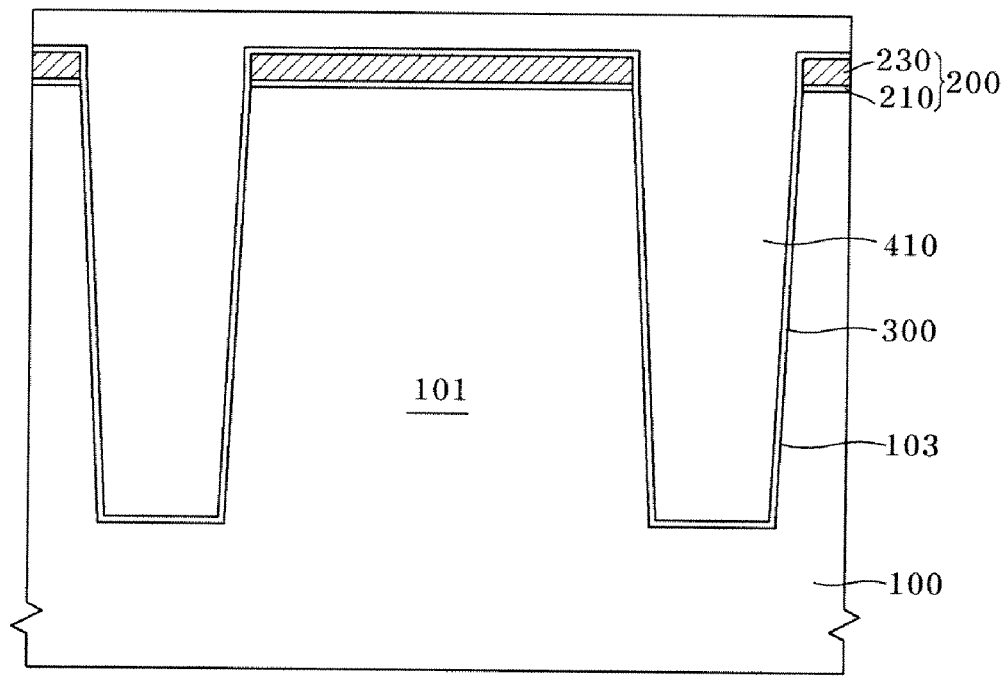

Referring to FIG. 3, a liner 300 is formed on an inner surface of the trench 103 and preferably also over the pad pattern 200. A first SOD layer 410 that fills the trench 103 is formed. The liner 300 can be formed, for example, as a multilayer liner, in which, for example, different kinds of partial or full insulation layers are stacked. For example, the liner 300 can be formed by performing thermal oxidation on the semiconductor substrate 100 to form a wall oxide layer on the exposed surface of the trench 103, and a silicon nitride layer can then formed on the wall oxide layer. A silicon oxide layer can then be deposited on the silicon nitride layer to form the liner 300.

The first SOD layer 410, substantially filling the trench 103, can be, for example, a polysilazane based SOD, which is useful to fill the trench 101 having a narrow CD required for a semiconductor device with a design rule of 50 nm and below. The first SOD layer 410 can be formed, for example, by mounting the semiconductor substrate 100 on a spin chuck of a spin coater, and coating a liquid polysilazane over the semiconductor substrate 100 while rotating the spin chuck. The polysilazane can fill the trench 103 during coating, since it is in a liquid phase and has flowability.

The first SOD layer 410 can be formed, for example, as an insulation layer of a substantially silicon oxide ($SiO_2$) structure by volatilizing the solvent of the coated polysilazane solution, and then curing the coated polysilazane. The first SOD layer 410 can be formed to a thickness of about 5500 Å, although the thickness can vary depending on the depth of the trench 103. After the semiconductor substrate 100 is coated, the semiconductor substrate 100 is preheated by being maintained for about 180 seconds on a hot chuck at about 150° C., and then is cured for 1 hour at a temperature of about 350° C. The curing can be carried out in an atmosphere of hydrogen gas ($H_2$) and oxygen gas ($O_2$). The $H_2$ and $O_2$ gases can be provided, for example, at a flow rate ratio of about 1:2. In this curing process, the high polymeric polysilazane reacts with the hydrogen and oxygen to generate the silicon oxide layer.

This polysilazane based SOD is a flowable insulation layer, which can overcome the problems associated with a SOD using a HydroSilsesQuinoxane (HSQ) based compound. The HSQ can cause an excessive stress in the active region by excessive contraction upon curing, and thus result in undesired deformation. Also, it can cause an internal void. Therefore, the HSQ is difficult to form as the isolation structure of a semiconductor device with a design rule of about 50 nm and below. The polysilazane based SOD can prevent internal void formation and excessive contraction, and thus is useful to form more stable isolation structure.

Figure 4:
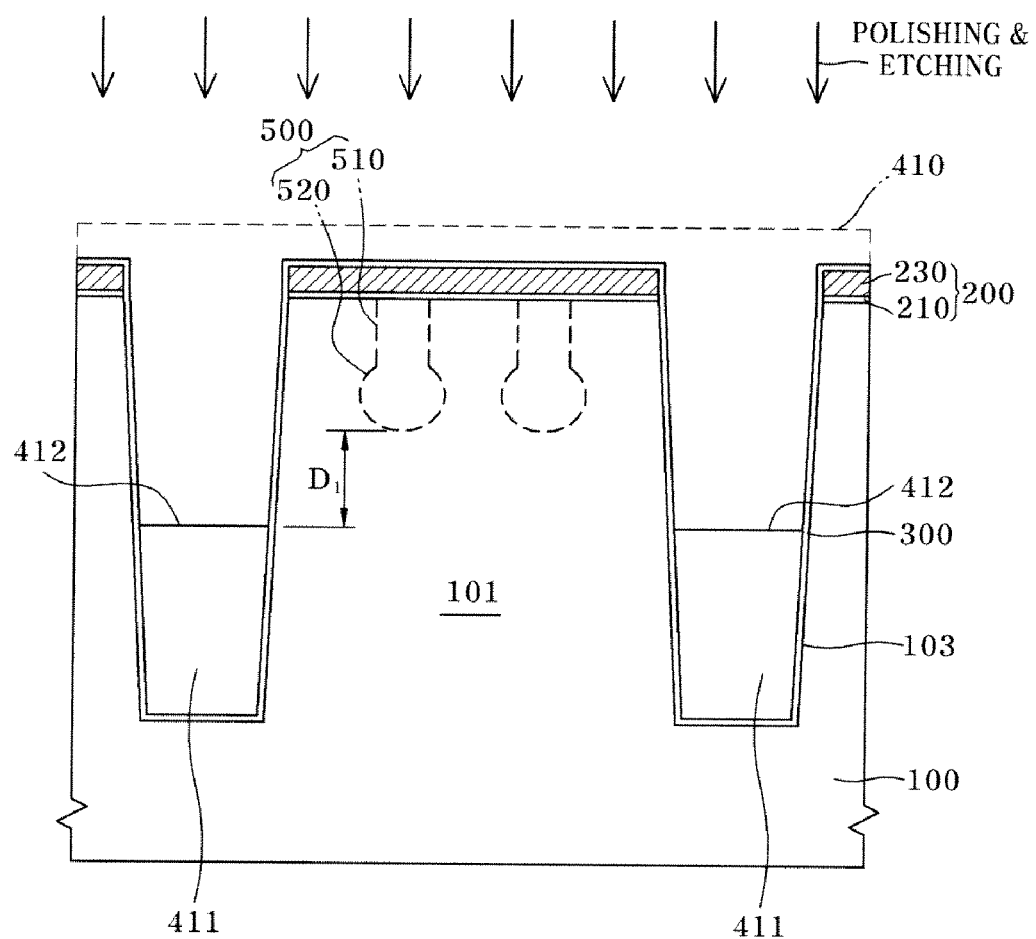

Referring to FIG. 4, the first SOD layer 410 can be planarized, for example by a Chemical Mechanical Polishing (CMP) process, to expose the surface of the pad pattern 200. The first SOD layer 410 can be etched to recess the first SOD layer 410, and thereby obtain a first recessed SOD 411 with a lowered surface 412. The first recessed SOD 411 is etched so that an upper surface 412 of the first recessed SOD 411 is spaced downwardly from the bottom of a subsequently formed recess groove 500 by a first height difference $D_1$. The first SOD layer 410 can be etched, for example, by a wet etching process, for example, using a HydroFluoric acid (HF) solution diluted to about 50:1. The etching process can remove, for example, a thickness of the first recessed SOD 411 in a range of 1700 to 1900 Å. The thickness of the first recessed SOD 411 removed by this etching process can vary with the thickness of the recess groove 500 to be subsequently formed in the active region 101.

The recess groove 500 can be subsequently formed in the active region 101 to extend the length of the channel, which is defined as a region overlapped with the active region by a gate, which fills the recess groove 500. This recess groove 500 can include an upper groove part 510 vertically formed with a first CD and a bulb part 520 formed on the bottom of the upper groove part 510 with a second CD wider than the first CD.

A stress shielding layer 430 is formed over the first recessed SOD 411 in order to prevent a tensile stress that can remain in the first recessed SOD 411 or a second SOD layer to be subsequently filled from spreading and affecting the recess groove 500. The stress shielding layer 430 can include, for example, an insulation layer having denser layer properties then the SOD, and thus having relatively superior resistance to deformation by stress. For example, a high density plasma oxide layer can be used as the insulation layer.

The effectiveness of the shielding effect against the remained stress can vary with the location of the stress shielding layer 430. The fact that an effectiveness of the stress shielding effect is varied as the correlation between the location of the stress shielding layer formed on the first recessed SOD 411 and the location of the bottom of the recess groove 500 can be confirmed by whether the refresh time of the DRAM memory cell having the transistor including the gate is lowered. From the result of the experimental observation, it can be confirmed that the stress shielding effect is effective when the lower surface of the stress shielding layer 430 is preferably spaced downwardly from the bottom of the recess groove 500 by at least about 500 Å, and the lowering in the refresh time of the DRAM memory cell constituted by the transistor including the gate that fills the recess groove 500 is restricted by this stress shielding. The first recessed SOD 411 is etched so that the first height difference $D_1$ between the upper surface 412 of the first recessed SOD 411 and the bottom of the recess groove 500 is at least in a range of 400 to 700 Å, preferably at least about 500 Å. The first recessed SOD 411 can be annealed for about 1 hour in an atmosphere of inert gas such as, for example, nitrogen ($N_2$) gas and at a temperature, for example, of about 950° C. to carry out a layer densification.

Figure 5:
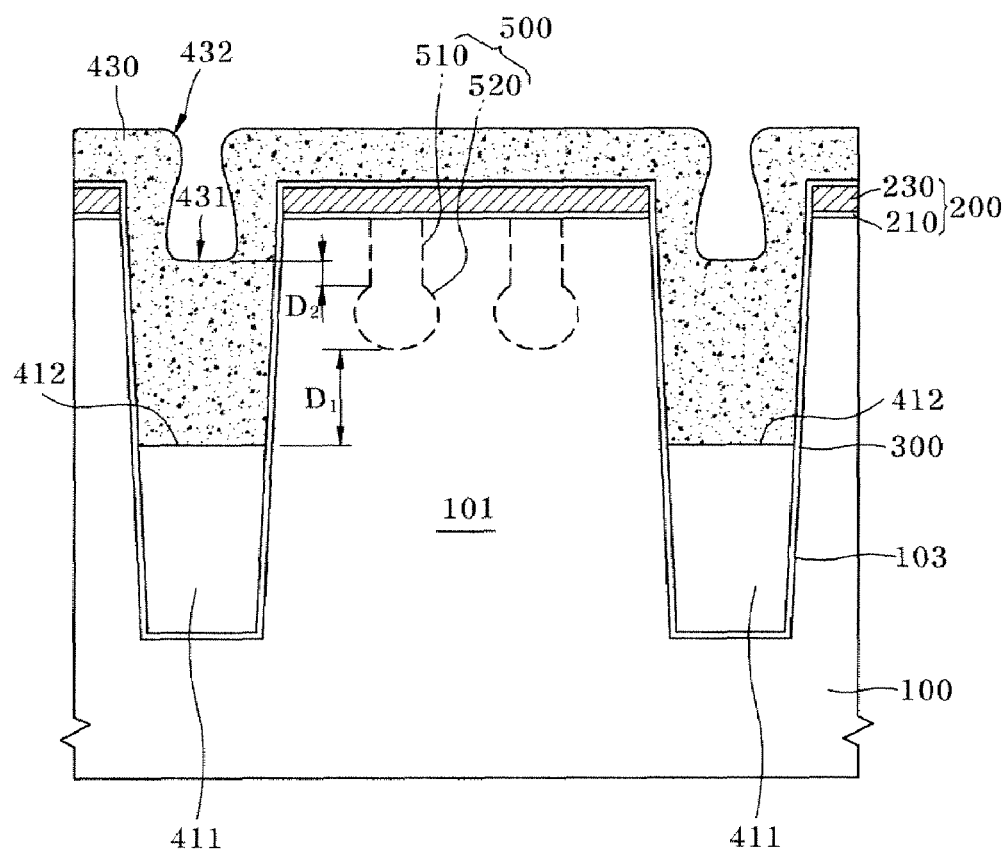

The stress shielding layer 430 formed as above mentioned can be formed, for example, to a thickness that covers the bottom of the recess groove 500, i.e. the width of the portion of the sidewall corresponding to the bulb part 520 in a horizontal direction, as shown in the cross-section in FIG. 5.

Referring to FIG. 5, a stress shielding layer 430 which is denser than the first recessed SOD 411 is formed over the first recessed SOD 411 and the pad patter 200, including the liner 300. This stress shielding layer 430 can be formed, for example, to a thickness such that an upper surface 431 is higher than the upper end portion of the bulb part 520. A second height difference $D_2$ between the upper end portion of the bulb part 520 and the upper surface 431 of the stress shielding layer is maintained at least in a range of 200 to 400 Å, preferably at least about 350 Å, though the second height difference $D_2$ can vary as the depth of the recess groove 500 or the size of the CD of the bulb part 520. This can be effective in restricting the lowering in the refresh time.

Therefore, even when a tensile stress remains in the first recessed SOD 411 below the stress shielding layer, the spreading of the stress to the recess groove 500 can be effectively shielded by the stress shielding layer 430, which resists against the tensile stress. Particularly, the voltage applied to the gate can be partially concentrated to the bulb part 520 of the recess groove, and the voltage concentration by the stress can become more serious when the stress spreading is allowed. The partial voltage concentration can cause the current leakage and thus induce an action that shortens the refresh time of the DRAM memory cell, but in an embodiment of the invention, shortening of the refresh time can be effectively restricted since the stress spreading can be effectively shielded.

It is preferable that the stress shielding layer 430 has denser layer properties and is more electrically stable as compared to a SOD. The stress shielding layer 430 can be, for example, a HDP oxide layer. The HDP oxide layer can be deposited, for example, using a HDP deposition chamber equipment. In the deposition chamber equipment, a process chamber having a chuck on which the semiconductor substrate 100 is to be mounted is provided in a cylindrical shape, a top plasma coil is disposed at an upper roof of the process chamber, and a side plasma coil is disposed at a side surface of the process chamber. The chuck can be connected to a bottom power providing DC voltage for applying bias to the rear surface of the semiconductor substrate 100 to induce straightness of the plasma.

By mounting the semiconductor substrate 100 within this process chamber, supplying a gas or gas mixture, such as oxygen gas/argon gas/helium gas, into the chamber in the directions of the side surface and the upper surface, and then exciting plasma, a plasma heating can be carried out for about 25 seconds. The power for the plasma excitation can be applied to the upper coil and the side coil, respectively.

A HDP seed layer can then be deposited as a liner with a thickness, for example, of about 160 Å by providing oxygen gas/silane gas ($SiH_4$) and helium gas and exciting the plasma. The HDP oxide layer is deposited in situ, for example, by In Situ Etch Assist (ISEA) deposition. ISEA deposition is a deposition method in which etch source gas such as nitrogen trifluoride gas ($NF_3$) is provided together with silicon source gas such as silane gas and oxidation gas. Thus the deposition action and the etching action are induced at the same time. This ISEA method is introduced so as to fill the trench 103 with narrower CD more effectively. This HDP oxide layer can be deposited, for example, to a thickness of about 800 Å.

Figure 6:
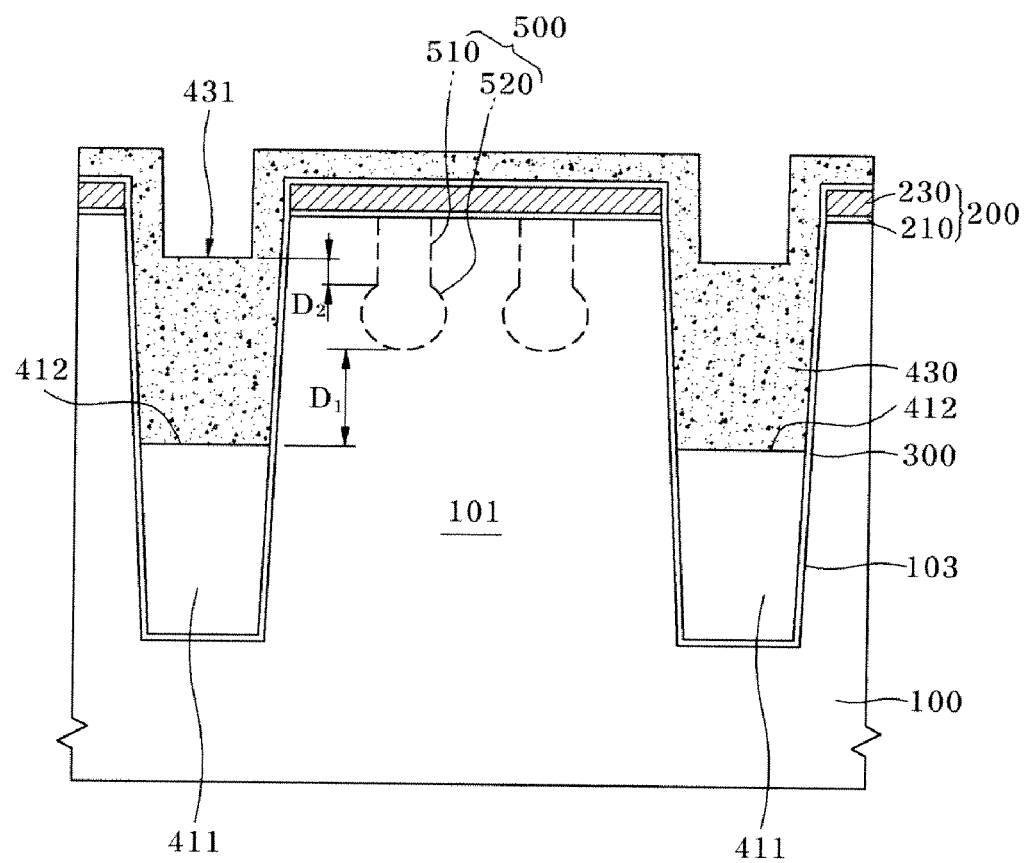

After the stress shielding layer 430 is formed (e.g., with the HDP oxide layer as aforementioned), an etching process for removing an overhang portion 432 if generated in the stress shielding layer 430 is carried out as shown in FIG. 6. Since this overhang 432 degrades the fill properties in subsequent deposition process, the overhang 432 is removed by etching, for example, wet etching in which a HF solution is diluted to about 300:1. The etching can be performed with an etch target in a range of 150 to 200 Å, for example.

Figure 7:
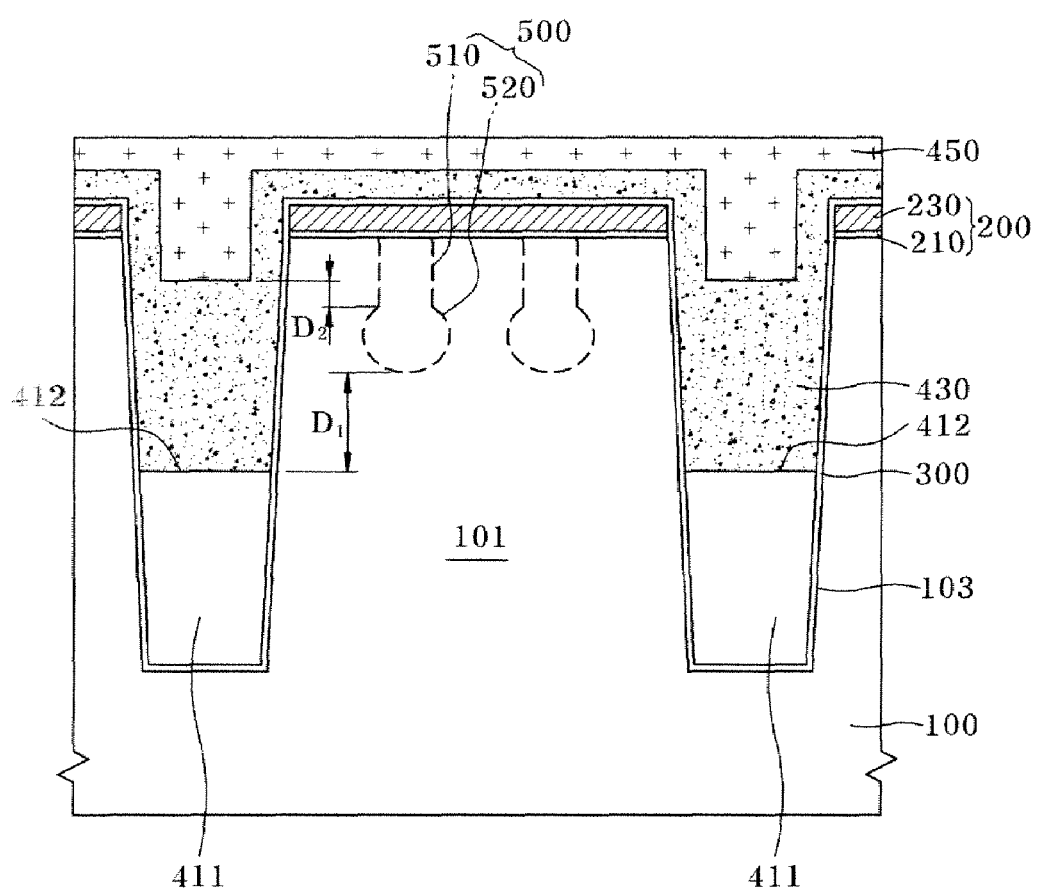

Referring to FIG. 7, a second SOD layer 450 is formed over the stress shielding layer 430 to completely fill the trench 103. The second SOD layer 450 can be formed, for example, by the same method as the first recessed SOD 411. Therefore, an isolation layer that fills the trench 103 can be formed having a three-layer structure.

Figure 8:
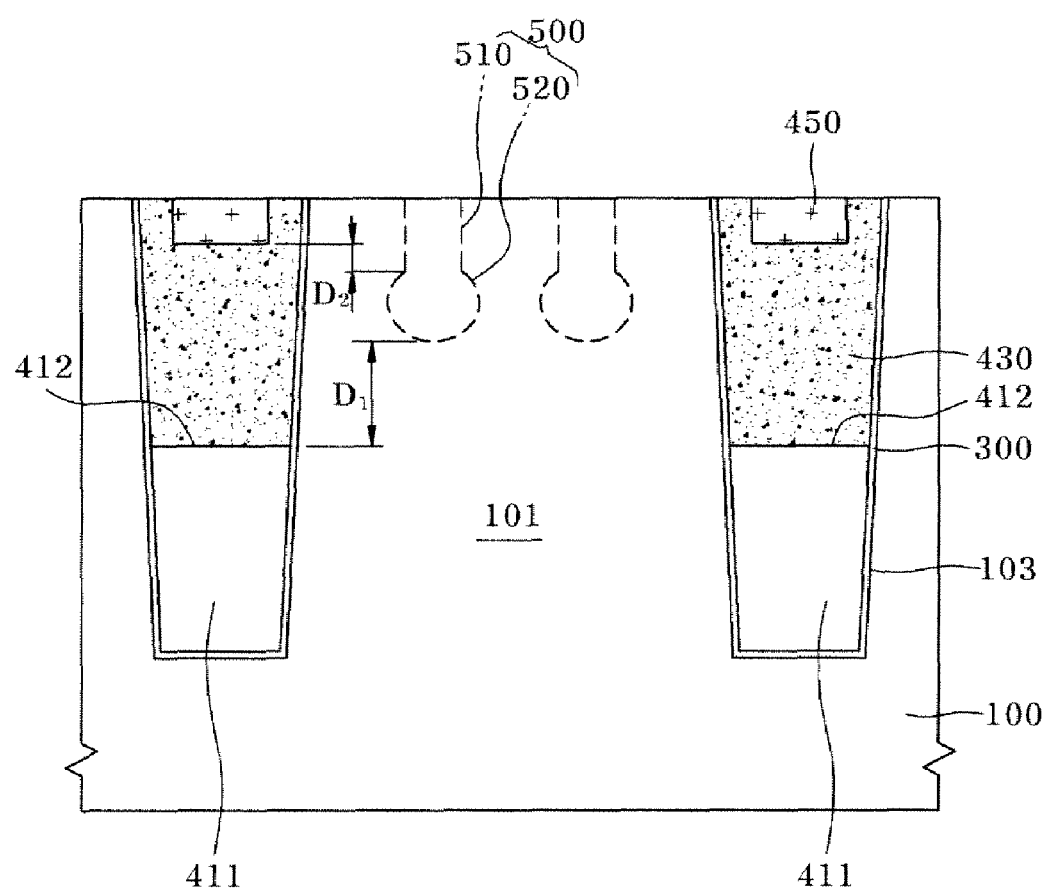

Referring to FIG. 8, the second SOD layer 450 is planarized, for example, by CMP or the like to expose the pad pattern 200 and a portion of the liner 300. The pad pattern 200 and liner 300 exposed by the planarization are selectively removed to form an isolation structure including the stress shielding layer 430 and the second SOD layer 450. The recess groove 500 is formed by carrying out a selective etching process on the active region 101. The recess groove 500 can be introduced so as to extend the length of the channel, which is defined as a region overlapped with the active region by the gate filling the recess groove 500. This recess groove 500 can be formed, for the effective extension of the channel length, so as to include the upper groove part 510 vertically formed with a first CD and the bulb part 520 formed on the bottom of the upper groove part 510 with a second CD wider than the first CD.

Figure 9:
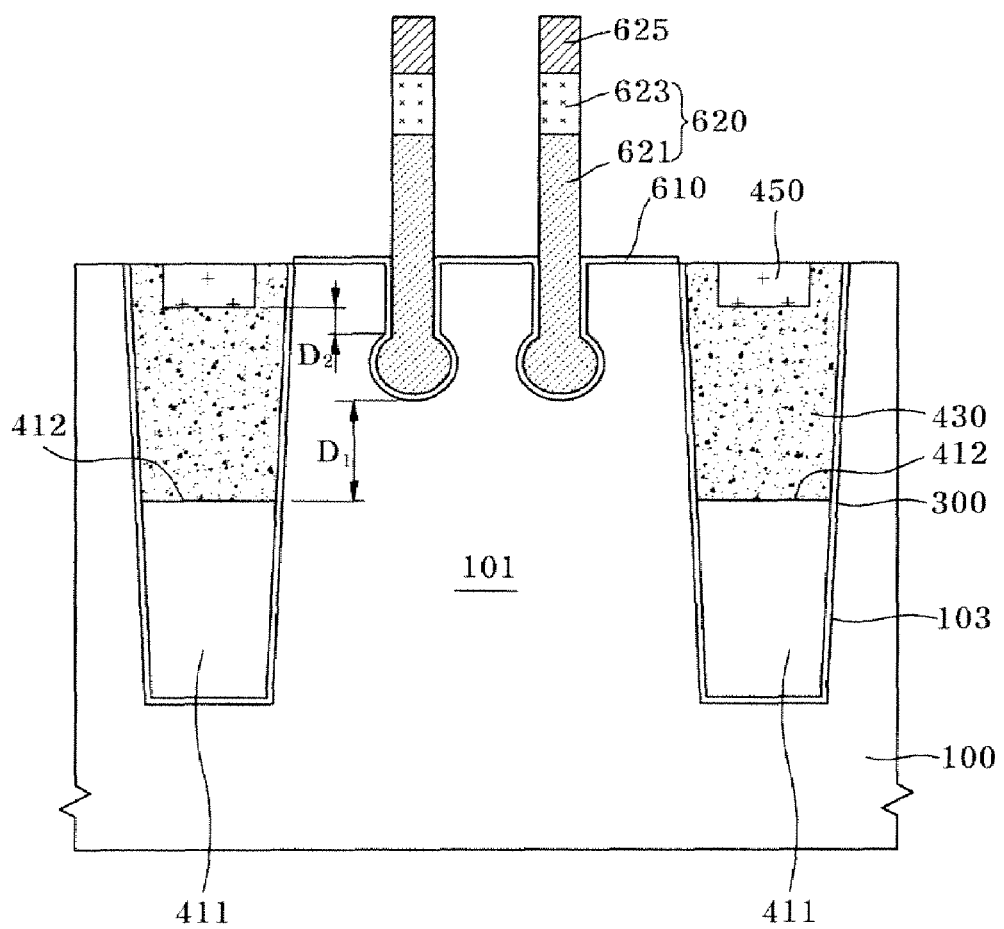

Referring to FIG. 9, a gate dielectric 610 is formed over the recess groove 500. A gate 620 that fills the recess groove 500 is formed over the gate dielectric 610. The gate 620 can include a conductive polysilicon layer 621 that fills the recess groove 500 and a metal layer 623 such as tungsten (W). Also, a capping layer 625 for protecting the gate 620 during patterning of the gate 620 and subsequent formation of a contact can be formed, and can include, for example, a silicon nitride layer. Since the channel of the transistor is formed in the portion of the active region 101 overlapped with the gate 620, the channel length can be extended.

The memory cell of the DRAM device can include a transistor including the gate 620 and a capacitor connected to the transistor. Since the effects of the tensile stress (which can remain in the SOD layers 411, 450) on the bottom of the recess groove 500 can be effectively restricted, it is possible to restrict generation of the leakage current upon operation of the transistor. Therefore, it is possible to restrict an increase in the time between the refresh actions for maintaining data stored in the memory cell, i.e. the refresh time is shortened and thus a longer refresh time can be maintained.

Figure 10:
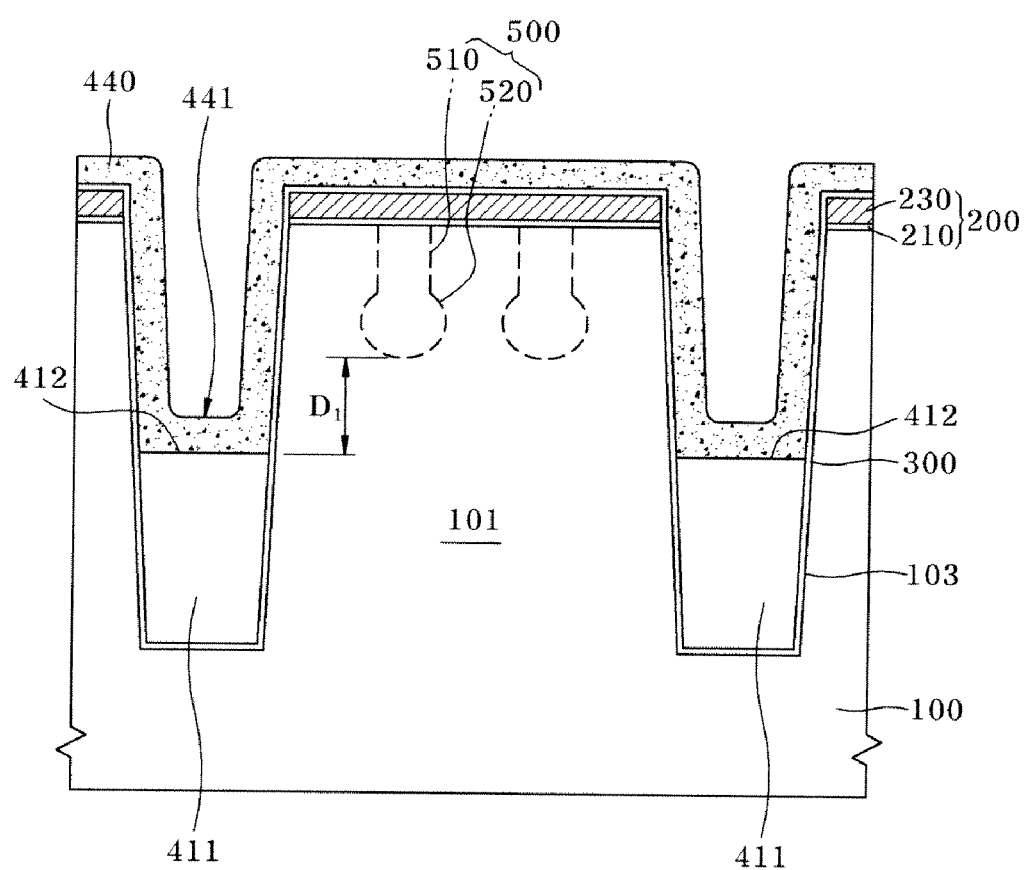
FIGS. 10 to 12 are cross-sectional views illustrating a semiconductor device having a recess gate and an isolation structure and a method for fabricating the same according to another embodiment of the invention.
Figure 11:
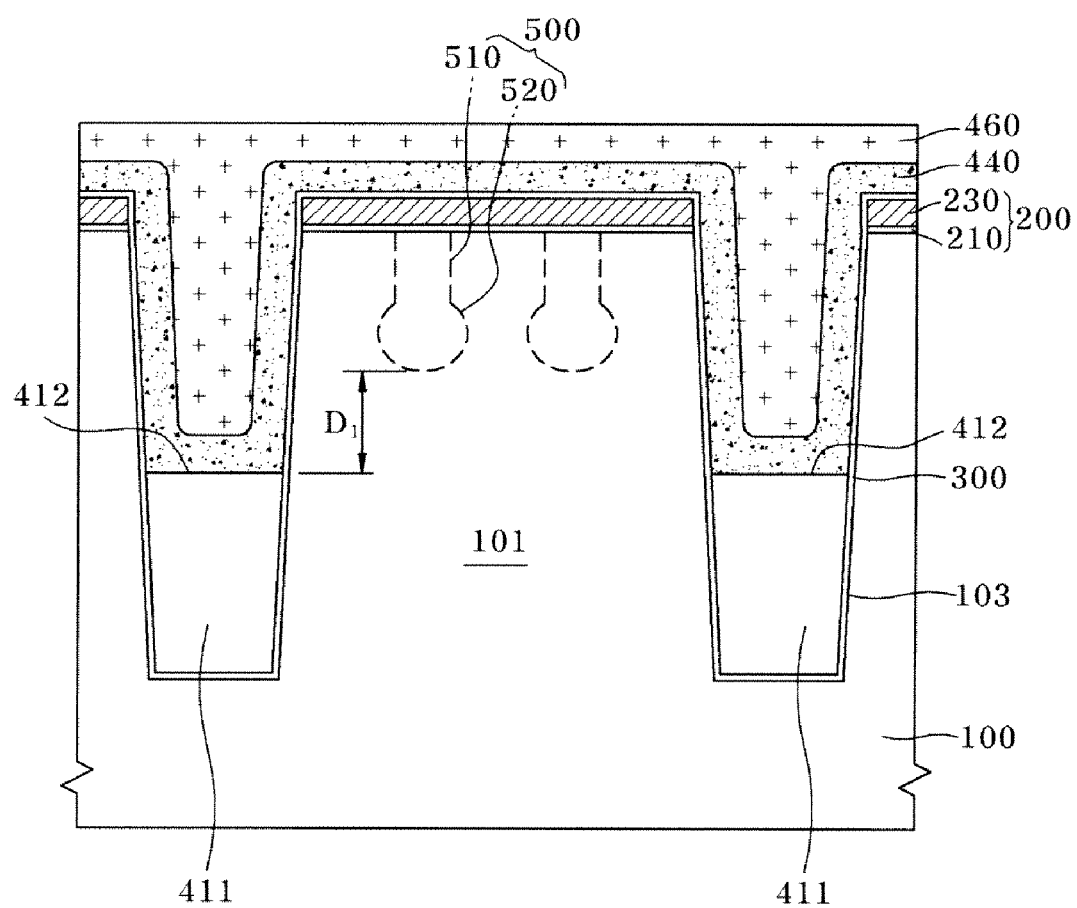
Figure 12:
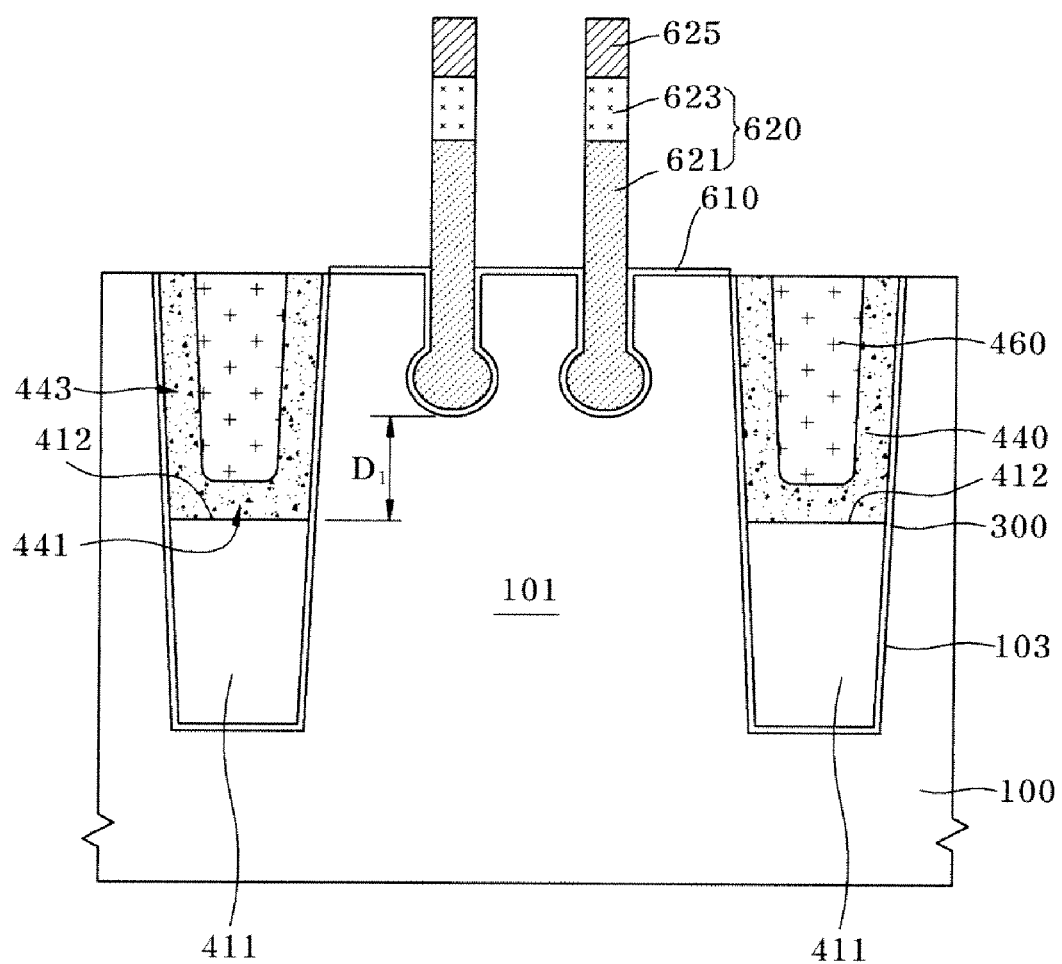

FIGS. 10 to 12 are cross-sectional views illustrating a semiconductor device having a recess gate and an isolation structure and a method for fabricating the same according to another embodiment of the invention, in which like reference numbers in the Figures refer to like elements.

Referring to FIG. 10, a trench 103, a pad pattern 200, a liner 300, and a first recessed SOD 411 can be formed, for example, as described above. The first recessed SOD 411 that partially fills the trench 103 is formed so as to have the upper surface 412 spaced downwardly from the recess groove 500 by the first height difference $D_1$, and a stress shielding layer 440 is then formed, including, for example, an HDP oxide layer, over the first recessed SOD 411. The stress shielding layer 440 can be formed to a thickness that results in the upper surface 441 being lower than the upper end portion of the bulb part 520 of the recess groove 500. The portion of the stress shielding layer 440 that is extended over the side wall of the trench 103 is deposited so as to extend higher than the upper end portion of the bulb part 520. Therefore, the stress shielding layer 440 can be deposited to thinner thickness and thus it is possible to maintain a wider trench entrance. Therefore, it is possible to enhance the gap fill properties upon subsequent deposition of the second SOD layer 460. After the stress shielding layer 440 is formed, an etching process for removing an overhang can be further carried out.

Referring to FIG. 11, a second SOD layer 460 is formed over the stress shielding layer 440.

Referring to FIG. 12, the second SOD layer 460 is planarized, for example, by CMP or the like, to expose the pad pattern 200 and a portion of the liner 300. The pad pattern 200 and liner 300 exposed by the planarization are selectively removed to form an isolation structure including the first recessed SOD 411, the stress shielding layer 440, and the second SOD layer 460. The recess groove (shown filled with a conductive layer 621 in FIG. 12) 500 is formed by selective etching the active region 101. The stress shielding layer 440, can be formed, for example to have a concave shaped cross-section. Although the height of the upper surface 411 of the stress shielding layer 440 is lower than that of the upper end portion of the bulb part 520, the vertical side wall 443 can be formed to cover the portion of the side wall of the trench 103 that is spaced upwardly from the upper end portion of the bulb part 520 of the recess groove 500. Therefore, it is possible to restrict the tensile stress generated in the SOD from spreading to the bulb part 520 of the recess groove 500. The gate dielectric 610, a gate 620 that fills the recess groove 500, and capping layer 625 can be formed, for example, as described above.

Figure 13:
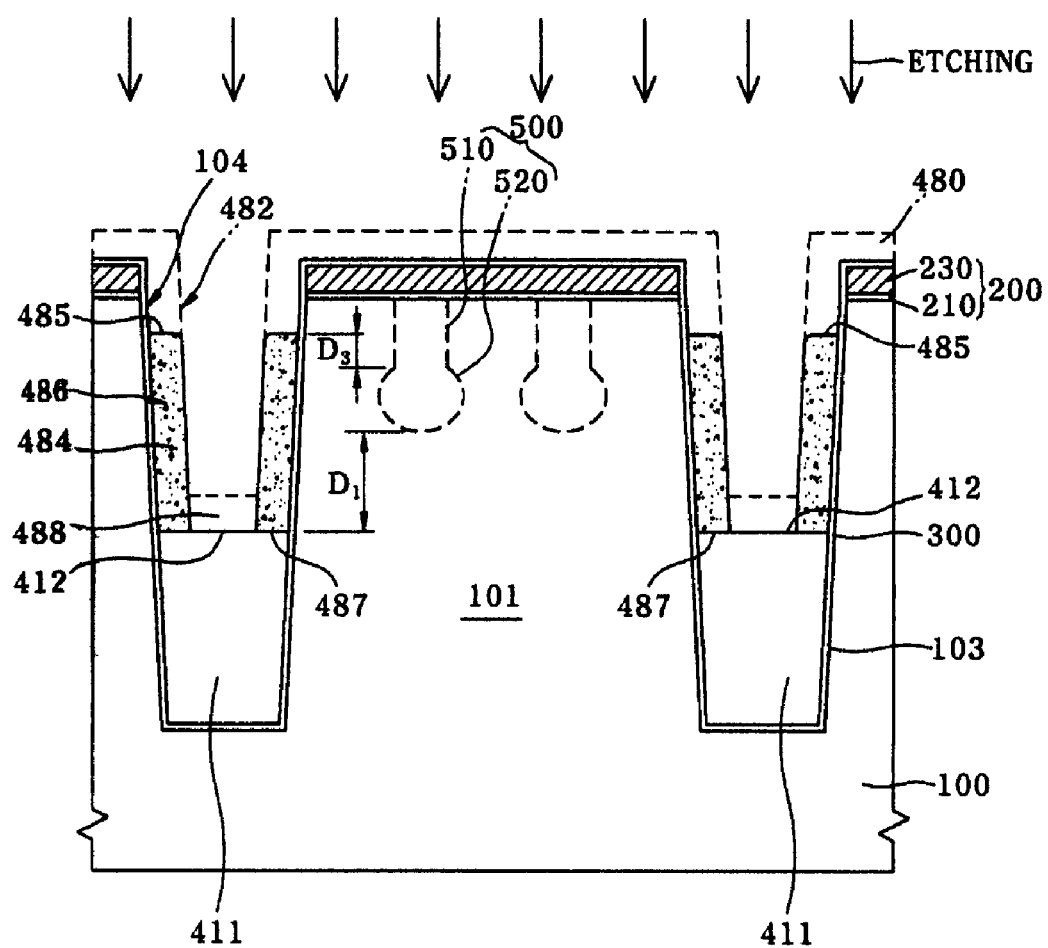
FIGS. 13 to 14 are cross-sectional views illustrating a semiconductor device having a recess gate and an isolation structure and a method for fabricating the same according to yet another embodiment of the invention.
Figure 14:
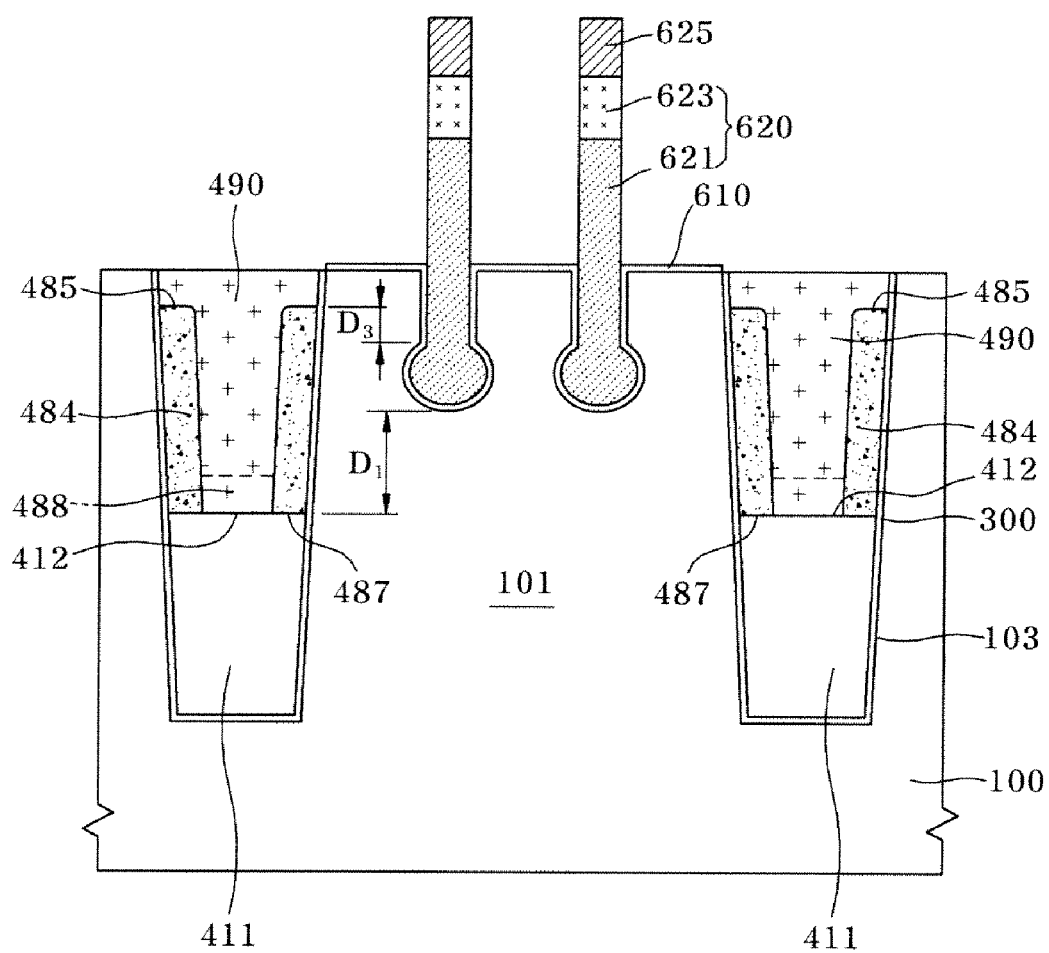

FIGS. 13 to 14 are cross-sectional views illustrating a semiconductor device having a recess gate and an isolation structure and a method for fabricating the same according to a second embodiment of the invention, wherein like reference numbers in the Figures refer to like elements.

Referring to FIG. 13, a trench 103, a pad pattern 200, a liner 300, and a first recessed SOD 411 can be formed, for example, as described above. The first recessed SOD 411 that partially fills the trench 103 is formed so as to have the upper surface 412 spaced downwardly from the recess groove 500 by a first height difference $D_1$, and a stress shielding layer 480 is then formed, including, for example, a HDP oxide layer, over the first recessed SOD 411. The upper surface of the stress shielding layer 480 can be formed to a thickness such that its upper surface in the trench 103 is lower than the upper end portion of the bulb part 520. A portion of the stress shielding layer 480 that extends over the side wall of the trench 103 is deposited so as to be extended higher than the upper end portion of the bulb part 520. The stress shielding layer 480 can be formed, for example, to have a concave shape.

The stress shielding layer 480 is recessed so that the entrance side portion 104 of the side wall of the trench 103 is exposed. The stress shielding layer 480 can be recessed, for example, by anisotropically etching the stress shielding layer 480. The upper portion 482 of the concaved side wall of the stress shielding layer 480 is etched and the upper portion 482 can thus become relatively thin or be removed. Since the entrance side portion 104 of the side wall of the trench is exposed, the entrance of the trench 103 becomes relatively wide. Therefore, it is possible to enhance the gap fill properties upon subsequent deposition of a second SOD layer.

The remaining portion 486 of the side wall of the stress shielding layer 484 can be maintained vertically so as to cover the portion of the side wall of the trench 103 that is spaced upwardly from the upper end portion of the bulb part 520 of the recess groove 500. Therefore, the height difference $D_3$ between the upper surface 485 of the side wall portion 486 of the stress shielding layer 484 and the upper end portion of the bulb part 520 can be maintained at least about 350 Å, and it is thus possible to effectively shield the stress from spreading.

The bottom 488 of the stress shielding layer 484 can also become thin or be removed by being etched during the etching process. In the case that the bottom 488 is removed, the stress shielding layer 484 remaining on the side wall of the trench 103 in a shape of a spacer. The lower end 487 of the spacer has the height difference $D_1$ with respect to the lower end portion of the bulb part 520 in the bottom of the recess groove 500, and the upper end 485 of the spacer has the height difference $D_3$ with respect to the upper end portion of the bulb part 520 in the bottom of the recess groove 500. Since the stress shielding layer 484 having the spacer shape is also attached so as to cover portion of the side wall of the trench corresponding to the bulb part 520, it can carry out effectively the stress shielding action.

Referring to FIG. 14, a second SOD layer 490 is formed over the stress shielding layer 484 and then planarized to form the isolation structure. The recess groove 500 is formed by carrying out the selective etching process on the active region 101. A gate dielectric 610, a gate 620 that fills the recess groove 500, and a capping layer 625 can be formed, for example, as described above.

While the invention has been described with respect to the specific embodiments, it will be apparent to those skilled in the art that various changes and modifications can be made without departing from the spirit and scope of the invention as defined in the following claims.

What is claimed is:

1. A method for fabricating a semiconductor device, the method comprising:
   forming a trench by selectively etching an isolation region of a semiconductor substrate to define an active region;
   forming a first Spin On Dielectric (SOD) partially filling the trench;
   forming a stress shielding layer over the first SOD, the stress shielding layer being denser than the first SOD;
   forming a second SOD that fills the trench over the first SOD including the stress shielding layer,
   forming a recess groove by selectively etching a portion of the active region of a semiconductor substrate, wherein the upper surface of the first SOD is spaced downwardly from the bottom of the recess groove, and the upper surface of the stress shielding layer inside the trench is spaced upwardly from the bottom of the recess groove; and
   forming a gate of a transistor that fills the recess groove.

2. The method of claim 1, comprising forming the recess groove by:
   forming a vertical upper groove part having a first Critical Dimension (CD); and
   forming a bulb part having a relatively wide second CD at the bottom of the recess groove by etching a bottom of the upper groove part,
   wherein the upper surface of the stress shielding layer is spaced upwardly from the upper end of the bulb part and the lower end of the stress shielding layer is spaced downwardly from the lower end of the bulb part.

3. The method of claim 1, comprising forming the first SOD from a polysilazane based dielectric material.

4. The method of claim 1, comprising forming the stress shielding layer to have an upper surface spaced upwardly from the bottom of the recess groove by a distance in a range of 200 to 400 Å.

5. The method of claim 1, further comprising removing an overhang portion of the stress shielding layer generated in an entrance of the trench by wet etching the stress shielding layer.

6. The method of claim 1, comprising forming the stress shielding layer such that the upper surface of the stress shielding layer inside the trench is spaced upwardly from the bottom of the recess groove by a distance greater than the width of the bottom of the recess groove.

7. The method of claim 1, comprising forming the first SOD by:
   coating the first SOD on the semiconductor substrate so as to fill the trench;
   curing the first SOD;
   lowering a height of the upper surface of the first SOD by etching the first SOD; and
   annealing the first SOD to densify the first SOD.

8. The method of claim 7, comprising etching the first SOD so that the upper surface of the first SOD is spaced downwardly from the bottom of the recess groove by a distance in a range of 400 to 700 Å.

9. The method of claim 1, comprising forming the stress shielding layer by depositing a High Density Plasma (HDP) oxide layer.

10. The method of claim 9, comprising depositing the HDP oxide layer by an In Situ Etch Assist (ISEA) deposition, wherein an etch source gas is provided with a silicon source gas and oxidation source gas, and the deposition and etching are performed at substantially the same time.

11. A method for fabricating a semiconductor device, the method comprising:
    forming a trench by selectively etching an isolation region of a semiconductor substrate to define an active region;
    forming a first SOD partially filling the trench;
    forming a stress shielding layer over the first SOD, wherein the stress shielding layer is denser than the first SOD and has a concave shape;
    forming a second SOD over the first SOD including the stress shielding layer;
    forming a recess groove comprising a vertical groove part and a bottom bulb part by selectively etching a portion of the active region of the semiconductor substrate, wherein the upper surface of the first SOD is spaced downwardly from the lower end of the bulb part of the recess groove, and the side wall of the stress shielding layer extends vertically to cover the side wall of the trench which is spaced upwardly from the upper end of the bulb part of the recess groove; and
    forming a gate of a transistor that fills the recess groove.

12. The method of claim 11, further comprising etching the stress shielding layer to remove a portion of the side wall of the stress shielding layer and expose an entrance side portion of the side wall of the trench.

13. The method of claim 11, comprising forming the stress shielding layer of a HDP oxide layer.

14. The method of claim 13, further comprising etching the stress shielding layer to expose at least a portion of the first SOD, wherein the etched stress shielding layer has a side wall spacer shape.

15. A semiconductor device, comprising:
    a gate of a transistor filling a recess groove formed in an active region on a portion of a semiconductor substrate;
    a trench for an isolation region formed in another portion of the semiconductor substrate to define the active region;
    a first SOD partially filling the trench and having an upper surface spaced downwardly from a bottom of the recess groove;
    a stress shielding layer formed over the first SOD, the stress shielding layer being denser than the first SOD and having an upper surface inside the trench spaced upwardly from the bottom of the recess groove; and
    a second SOD formed over the first SOD and the stress shielding layer and filling the trench.

16. The semiconductor device of claim 15, wherein the SOD is formed of a polysilazane based dielectric material, and the stress shielding layer is formed of a HDP oxide layer.

17. The semiconductor device of claim 15, wherein the upper surface of the first SOD is spaced downwardly from the bottom of the recess groove by a distance in a range of 400 to 700 Å, and
    the upper surface of the stress shielding layer is spaced upwardly from the bottom of the recess groove by a distance in a range of 200 to 400 Å.

18. A semiconductor device, comprising:
    a gate of a transistor filling a recess groove formed in an active region on a portion of a semiconductor substrate, the recess groove comprising a vertical groove part and a bottom bulb part;
    a trench for an isolation region formed in another portion of the semiconductor substrate so as to define the active region;
    a first SOD partially filling the trench and having an upper surface spaced downwardly from a bottom of the recess groove;
    a concave shaped stress shielding layer formed over the first SOD, the stress shielding layer being denser than the first SOD and having a vertical side wall extended to cover a portion of a side wall of the trench spaced upwardly from an upper end of the bulb part of the recess groove; and
    a second SOD formed over the first SOD and the stress shielding layer and filling the trench.

19. The semiconductor device of claim 18, wherein the vertical side wall of the stress shielding layer is disposed below an entrance portion of the side wall of the trench.

20. The semiconductor device of claim 19, wherein a bottom of the stress shielding layer exposes at least a portion of the first SOD.

* * * * *